United States Patent
Fujimaki

(10) Patent No.: US 12,542,412 B2
(45) Date of Patent: Feb. 3, 2026

(54) GAS LASER DEVICE AND ELECTRONIC DEVICE MANUFACTURING METHOD

(71) Applicant: Gigaphoton Inc., Tochigi (JP)

(72) Inventor: Yousuke Fujimaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 115 days.

(21) Appl. No.: 18/402,835

(22) Filed: Jan. 3, 2024

(65) Prior Publication Data

US 2024/0136787 A1 Apr. 25, 2024

Related U.S. Application Data

(63) Continuation of application No. PCT/JP2021/031622, filed on Aug. 27, 2021.

(51) Int. Cl.
*G03F 7/20* (2006.01)
*G03F 7/00* (2006.01)
(Continued)

(52) U.S. Cl.
CPC .......... *H01S 3/139* (2013.01); *G03F 7/70025* (2013.01); *G03F 7/7015* (2013.01);
(Continued)

(58) Field of Classification Search
CPC ........ H01S 3/139; H01S 3/034; H01S 3/1305; H01S 3/23; H01S 3/10069; H01S 3/086;
(Continued)

(56) References Cited

U.S. PATENT DOCUMENTS

2008/0037609 A1 2/2008 Nagai et al.
2010/0220756 A1 9/2010 Krzysztof et al.
(Continued)

FOREIGN PATENT DOCUMENTS

JP 2008-042072 A 2/2008
JP 2008-103604 A 5/2008
(Continued)

OTHER PUBLICATIONS

International Search Report issued in PCT/JP2021/031622; mailed Nov. 9, 2021.
IPRP and Written Opinion issued in PCT/JP2021/031622; issued Feb. 27, 2024.

*Primary Examiner* — Mesfin T Asfaw
(74) *Attorney, Agent, or Firm* — Studebaker Brackett PLLC

(57) ABSTRACT

A gas laser device includes a laser oscillator outputting laser light, and a laser amplifier amplifying the laser light and outputting the amplified laser light. The laser amplifier includes a discharge chamber accommodating electrodes for causing discharge, an input coupling optical system causing part of the laser light to be transmitted toward the discharge chamber, and an output coupling optical system configuring an optical resonator together with the input coupling optical system and causing part of the laser light transmitted through the input coupling optical system and the discharge chamber to be transmitted therethrough and output the amplified laser light. A first focal point of the input coupling optical system and a second focal point of the output coupling optical system in a first direction being perpendicular to a direction of the discharge coincides at a position between the input coupling optical system and the output coupling optical system.

18 Claims, 8 Drawing Sheets

(51) Int. Cl.
*H01S 3/034* (2006.01)
*H01S 3/13* (2006.01)
*H01S 3/139* (2006.01)
*H01S 3/23* (2006.01)

(52) U.S. Cl.
CPC ............ *H01S 3/034* (2013.01); *H01S 3/1305* (2013.01); *H01S 3/23* (2013.01)

(58) Field of Classification Search
CPC ...... H01S 3/105; H01S 3/0014; H01S 3/0071; H01S 3/08004; H01S 3/08009; H01S 3/225; H01S 3/2325; G03F 7/70025; G03F 7/7015
See application file for complete search history.

(56) References Cited

U.S. PATENT DOCUMENTS

2013/0156054 A1  6/2013  Danekar et al.
2016/0336713 A1* 11/2016  Nogiwa ............. G02B 19/0095

FOREIGN PATENT DOCUMENTS

| JP | 2008-277618 A | 11/2008 |
| JP | 2008-288321 A | 11/2008 |
| JP | 2008-288322 A | 11/2008 |
| JP | 2009-099727 A | 5/2009 |
| JP | 2010-226096 A | 10/2010 |
| JP | 2012-156531 A | 8/2012 |

* cited by examiner

GAS LASER DEVICE AND ELECTRONIC DEVICE MANUFACTURING METHOD

CROSS-REFERENCE TO RELATED APPLICATIONS

The present application claims the benefit of International Application No. PCT/JP2021/031622, filed on Aug. 27, 2021, the entire contents of which are hereby incorporated by reference.

BACKGROUND

1. Technical Field

The present disclosure relates to a gas laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing laser device.

LIST OF DOCUMENTS

Patent Documents

Patent Document 1: Japanese Patent Application Publication No. 2012-156531

SUMMARY

A gas laser device according to an aspect of the present disclosure includes a laser oscillator configured to output laser light, and a laser amplifier configured to amplify the laser light and output the amplified laser light. Here, the laser amplifier includes a discharge chamber accommodating a pair of electrodes for causing discharge, an input coupling optical system configured to cause at least a part of the laser light to be transmitted toward the discharge chamber, and an output coupling optical system configuring an optical resonator together with the input coupling optical system and configured to cause at least a part of the laser light transmitted through the input coupling optical system and the discharge chamber to be transmitted therethrough and output the amplified laser light. A first focal point of the input coupling optical system in a first direction being perpendicular to a direction of the discharge and a second focal point of the output coupling optical system in the first direction coincides with each other at a position between the input coupling optical system and the output coupling optical system.

An electronic device manufacturing method according to an aspect of the present disclosure includes generating amplified laser light using a gas laser device, outputting the amplified laser light to an exposure apparatus, and exposing a photosensitive substrate to the amplified laser light in the exposure apparatus to manufacture an electronic device. Here, the gas laser device includes a laser oscillator configured to output laser light and a laser amplifier configured to amplify the laser light and output the amplified laser light. The laser amplifier includes a discharge chamber including a pair of electrodes for causing discharge, an input coupling optical system configured to cause at least a part of the laser light to be transmitted toward the discharge chamber, and an output coupling optical system configuring an optical resonator along with the input coupling optical system and configured to cause at least a part of the laser light transmitted through the input coupling optical system and the discharge chamber and output the amplified laser light. A first focal point of the input coupling optical system in a first direction being perpendicular to a direction of the discharge and a second focal point of the output coupling optical system in the first direction coincides with each other at a position between the input coupling optical system and the output coupling optical system.

BRIEF DESCRIPTION OF THE DRAWINGS

Embodiments of the present disclosure will be described below merely as examples with reference to the accompanying drawings.

DESCRIPTION OF EMBODIMENTS

Figure 1:
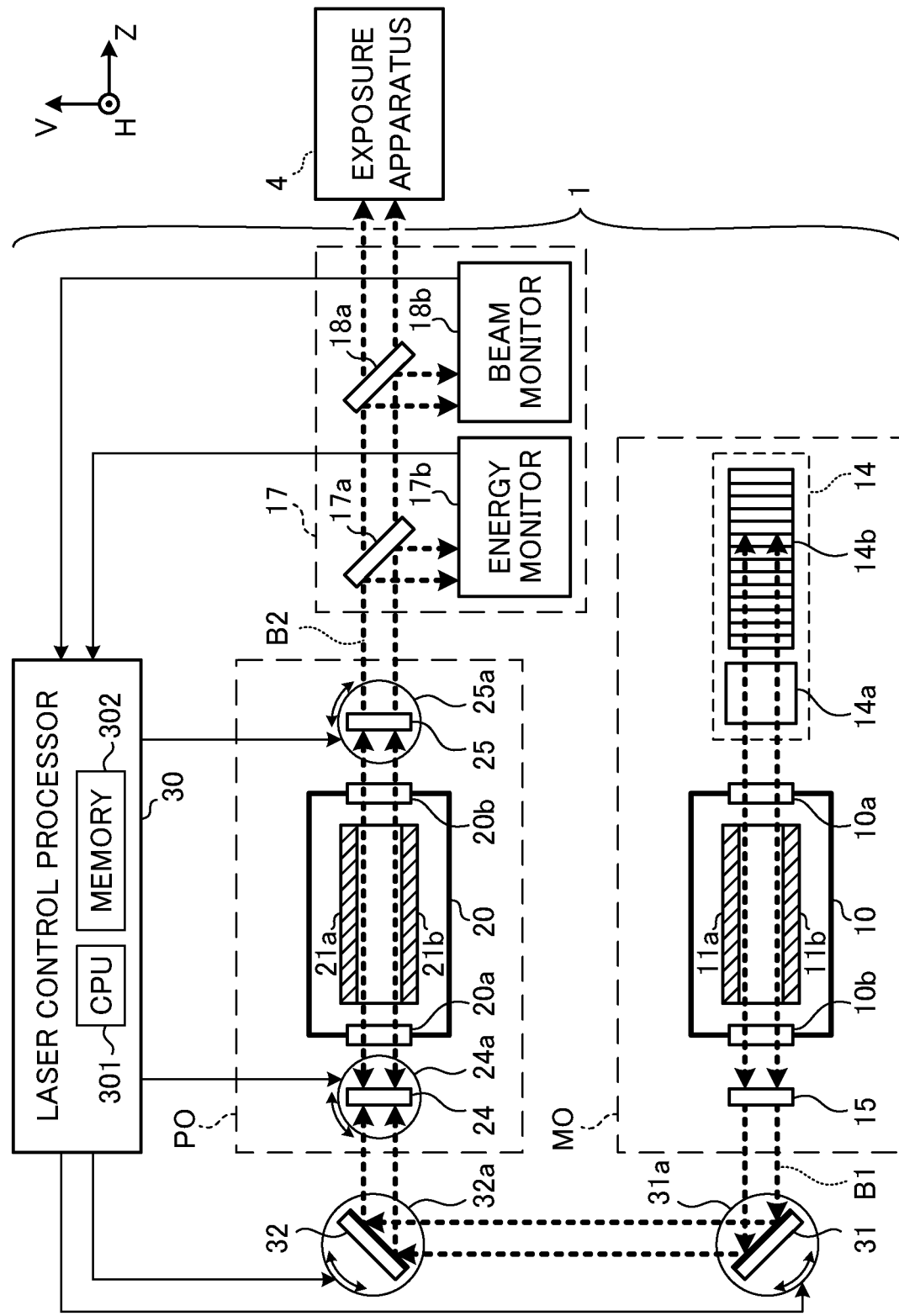
FIG. 1 schematically shows the configuration of a gas laser device in a comparative example.

<Contents>
1. Comparative example
    1.1 Configuration
        1.1.1 Master oscillator MO
        1.1.2 High reflection mirrors 31, 32
        1.1.3 Power oscillator PO
        1.1.4 Laser monitor 17
        1.1.5 Laser control processor 30
    1.2 Operation
        1.2.1 Laser control processor 30
        1.2.2 Master oscillator MO
        1.2.3 High reflection mirrors 31, 32
        1.2.4 Power oscillator PO
        1.2.5 Laser monitor 17
        1.2.6 Voltage control
    1.3 Problem of comparative example
2. Gas laser device with rear mirror 24*b* and front mirror 25*b* being confocal resonator
    2.1 Configuration
    2.2 Operation
    2.3 Effect
3. Gas laser device in which each of rear mirror 24*c* and front mirror 25*c* includes cylindrical lens
    3.1 Configuration
    3.2 Operation
    3.3 Effect
4. Gas laser device including beam expander 23 on optical path of laser light B1
    4.1 Configuration
    4.2 Effect
5. Gas laser device in which curvature radius Rin of rear mirror 24*c* and curvature radius Rout of front mirror 25*c* are different
    5.1 Configuration
    5.2 Operation
    5.3 Effect
6. Gas laser device causing laser light B1 to be incident on position shifted in H-axis direction from center axis C of optical resonator
    6.1 Configuration
    6.2 Operation
    6.3 Effect
7. Gas laser device causing laser light B1 to be incident at angle shifted in H-axis direction with respect to center axis C of optical resonator
    7.1 Configuration
    7.2 Operation
    7.3 Effect
8. Gas laser device in which rear mirror 24*d* and front mirror 25*d* each include planoconcave lens
    8.1 Configuration
    8.2 Operation
    8.3 Effect
9. Example of beam monitor 18*b*
    9.1 Configuration
    9.2 Operation
10. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Comparative Example 1.1 Configuration

FIG. 1 schematically shows the configuration of a gas laser device 1 in a comparative example. The gas laser device 1 includes a master oscillator MO, a power oscillator PO, a laser monitor 17, a laser control processor 30, and high reflection mirrors 31, 32. The gas laser device 1 is connected to an exposure apparatus 4.

1.1.1 Master Oscillator MO

The master oscillator MO includes a discharge chamber 10, a pair of electrodes 11*a*, 11*b*, a line narrowing module 14, and a front mirror 15. The line narrowing module 14 and the front mirror 15 configure an optical resonator. The discharge chamber 10 is arranged on the optical path of the optical resonator. The master oscillator MO corresponds to the laser oscillator in the present disclosure.

The discharge chamber 10 is filled with a laser gas containing, for example, an argon gas or a krypton gas as a rare gas, a fluorine gas as a halogen gas, a neon gas as a buffer gas, and the like. Windows 10*a*, 10*b* are provided at both ends of the discharge chamber 10.

The line narrowing module 14 includes a prism 14*a* and a grating 14*b*. Instead of the line narrowing module 14, a high reflection mirror may be used.

The front mirror 15 is made of a material that transmits light having a wavelength selected by the line narrowing module 14, and one surface thereof is coated with a partial reflection film.

1.1.2 High Reflection Mirrors 31, 32

The high reflection mirrors 31, 32 are arranged on the optical path of laser light B1 output from the master oscillator MO.

The high reflection mirrors 31, 32 are configured such that the position and posture thereof can be changed by actuators 31*a*, 32*a*, respectively. The high reflection mirrors 31, 32 configure a beam steering unit for adjusting an incident position and an incident direction of the laser light B1 on the power oscillator PO.

1.1.3 Power Oscillator PO

The power oscillator PO is arranged on the optical path of the laser light B1 that has passed through the beam steering unit.

The power oscillator PO includes a discharge chamber 20, a pair of electrodes 21*a*, 21*b*, a rear mirror 24, and a front mirror 25. Windows 20*a*, 20*b* are provided at the discharge chamber 20. The power oscillator PO corresponds to the laser amplifier in the present disclosure.

Each of the rear mirror 24 and the front mirror 25 is made of a material that transmits laser light B1, and one surface thereof is coated with a partial reflection film. The rear mirror 24 corresponds to the input coupling optical system in the present disclosure, and the front mirror 25 corresponds to the output coupling optical system in the present disclosure. The reflectance of the rear mirror 24 is set higher than the reflectance of the front mirror 25. The rear mirror 24 and the front mirror 25 configure a Fabry-Perot type optical resonator.

The rear mirror 24 and the front mirror 25 are configured such that the posture thereof can be changed by actuators 24a, 25a, respectively.

In other respects, the above-described components of the power oscillator PO are similar to the corresponding components of the master oscillator MO.

The V-axis direction in which the electrodes 21a, 21b face each other is also referred to as a discharge direction. The Z-axis direction in which the rear mirror 24 and the front mirror 25 face each other is also referred to as a beam axis direction, and the V axis and the Z axis are perpendicular to each other. The H-axis direction perpendicular to both the V axis and the Z axis is also referred to as a horizontal direction. The H-axis direction corresponds to the first direction in the present disclosure.

1.1.4 Laser Monitor 17

The laser monitor 17 includes beam splitters 17a, 18a, an energy monitor 17b, and a beam monitor 18b. The beam splitters 17a, 18a are arranged on the optical path of amplified laser light B2 output from the power oscillator PO. The beam splitters 17a, 18a are configured to transmit a part of the amplified laser light B2 at high transmittance and reflect another part thereof.

The energy monitor 17b is arranged on the optical path of the laser light reflected by the beam splitter 17a. The energy monitor 17b includes a light concentrating optical system (not shown) and an optical sensor (not shown), and is configured to output an electric signal corresponding to the pulse energy of the amplified laser light B2. The beam monitor 18b is arranged on the optical path of the laser light reflected by the beam splitter 18a. The beam monitor 18b includes a beam profiler and is configured to output a beam profile at a beam cross section of the amplified laser light B2.

1.1.5 Laser Control Processor 30

The laser control processor 30 is a processing device including a memory 302 in which a control program is stored and a CPU 301 which executes the control program. The laser control processor 30 is specifically configured or programmed to perform various processes included in the present disclosure. The laser control processor 30 corresponds to the processor in the present disclosure.

1.2 Operation 1.2.1 Laser Control Processor 30

The laser control processor 30 sets a set voltage of a power source device (not shown) included in each of the master oscillator MO and the power oscillator PO. The laser control processor 30 also transmits a trigger signal to each of the power source devices.

1.2.2 Master Oscillator MO

When receiving the trigger signal from the laser control processor 30, the power source device included in the master oscillator MO applies a pulse high voltage corresponding to the set voltage between the electrodes 11a, 11b.

When the high voltage is applied between the electrodes 11a, 11b, discharge occurs between the electrodes 11a, 11b. The laser medium in the discharge chamber 10 is excited by the energy of the discharge and shifts to a high energy level. When the excited laser medium then shifts to a low energy level, light having a wavelength corresponding to the difference between the energy levels is emitted.

The light generated in the discharge chamber 10 is output to the outside of the discharge chamber 10 through the windows 10a, 10b. The beam width of the light output through the window 10a of the discharge chamber 10 is expanded by the prism 14a, and then the light is incident on the grating 14b.

The light incident on the grating 14b from the prism 14a is reflected by a plurality of grooves of the grating 14b and is diffracted in a direction corresponding to a wavelength of the light.

The prism 14a reduces the beam width of the diffracted light from the grating 14b and returns the light to the discharge chamber 10 through the window 10a.

The front mirror 15 transmits and outputs a part of the light output from the window 10b of the discharge chamber 10, and reflects the other part back into the discharge chamber 10.

In this way, the light output from the discharge chamber 10 reciprocates between the line narrowing module 14 and the front mirror 15, and is amplified each time the light passes through the discharge space between the electrodes 11a, 11b. The light is line narrowed each time being turned back in the line narrowing module 14. Thus, the light having undergone laser oscillation and line narrowing is output as the pulse laser light B1 from the front mirror 15.

1.2.3 High Reflection Mirrors 31, 32

The high reflection mirrors 31, 32 guide the laser light B1 to the rear mirror 24 of the power oscillator PO.

1.2.4 Power Oscillator PO

When receiving the trigger signal from the laser control processor 30, the power source device included in the power oscillator PO applies a pulse high voltage corresponding to the set voltage between the electrodes 21a, 21b. The delay time of the trigger signal for the power oscillator PO with respect to the trigger signal for the master oscillator MO is set so that the timing at which the discharge occurs between the electrodes 21a, 21b and the timing at which the laser light B1 enters the discharge chamber 20 via the rear mirror 24 and the window 20a are synchronized with each other.

The laser light B1 reciprocates between the rear mirror 24 and the front mirror 25, and is amplified each time it passes through the discharge space between the electrodes 21a, 21b. The amplified light is output from the front mirror 25 as the amplified laser light B2.

1.2.5 Laser Monitor 17

The energy monitor 17b detects pulse energy of the amplified laser light B2 and outputs the detection result to the laser control processor 30.

The beam monitor 18b detects a beam profile of the amplified laser light B2, and outputs the detection result to the laser control processor 30.

1.2.6 Voltage Control

The laser control processor 30 performs feedback control of the set voltage of the power oscillator PO based on the target pulse energy of the amplified laser light B2 and the pulse energy of the amplified laser light B2 received from the energy monitor 17b.

Further, between the master oscillator MO and the power oscillator PO, an energy monitor (not shown) for measuring the pulse energy of the laser light B1 may be arranged, and the set voltage of the master oscillator MO may be feedback-controlled based on the pulse energy of the laser light B1.

1.3 Problem of Comparative Example

Figure 2:
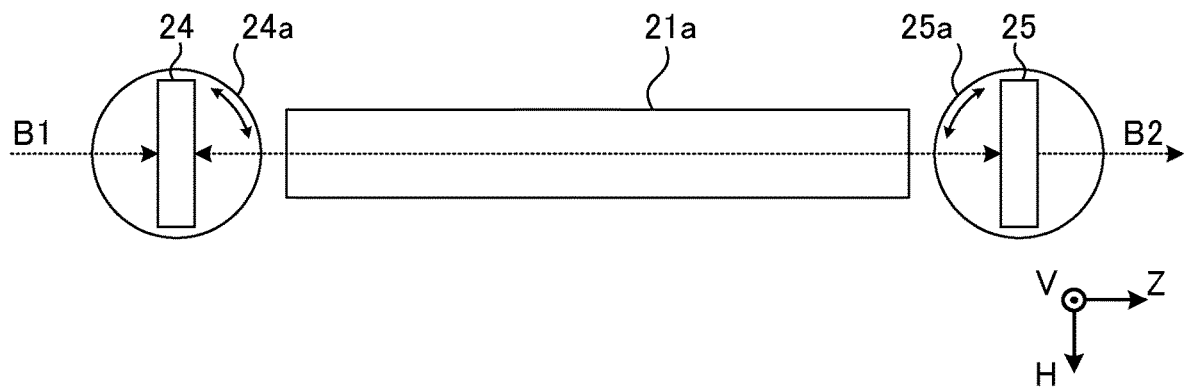
FIG. 2 shows an example of an optical path axis of laser light passing through a power oscillator in the comparative example.
Figure 3:
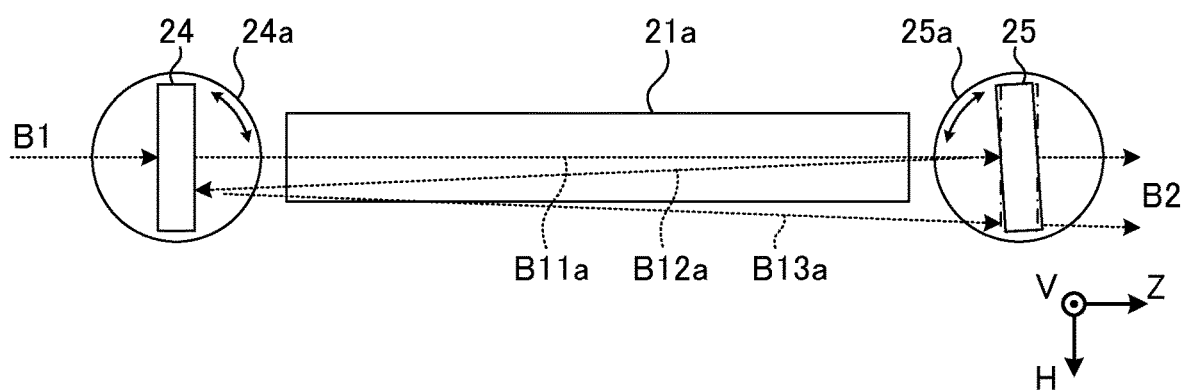
FIG. 3 shows an example of optical path axes of the laser light passing through the power oscillator in the comparative example.
Figure 4:
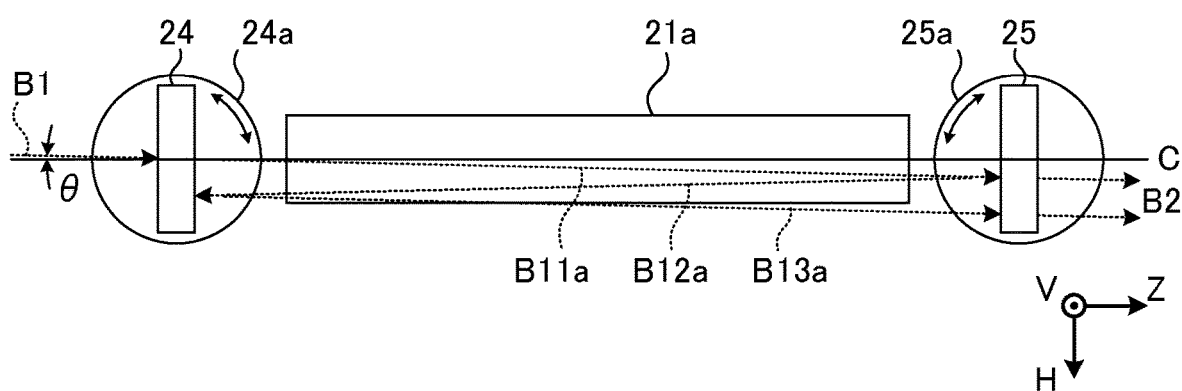
FIG. 4 shows an example of optical path axes of the laser light passing through the power oscillator in the comparative example.

FIGS. 2 to 4 show examples of optical path axes of the laser light passing through the power oscillator PO in the comparative example. In each of FIGS. 2 to 4, the discharge chamber 20 and the windows 20a, 20b configuring the power oscillator PO are not shown. The electrode 21b is not shown as being located at a position overlapping with the electrode 21a.

As shown in FIG. 2, when the reflection surface of the rear mirror 24 and the reflection surface of the front mirror 25 are parallel to each other and these reflection surfaces are perpendicular to the optical path axis of the laser light B1, the optical path axis of the amplified laser light B2 output from the power oscillator PO is substantially coaxial with the optical path axis of the laser light B1. This is the ideal state.

As shown in FIG. 3, when the reflection surface of the rear mirror 24 and the reflection surface of the front mirror 25 are not parallel to each other, the optical path axis changes in the order of B11a, B12a, and B13a as the laser light reciprocates between the rear mirror 24 and the front mirror 25. When the optical path axis deviates from the discharge space as the optical path axis B13a, the amplification efficiency of the laser light is reduced. Further, when shift of the optical path axis occurs every time the laser light reciprocates between the rear mirror 24 and the front mirror 25, the beam profile and the beam divergence of the amplified laser light B2 output from the power oscillator PO are not ideal. Therefore, the laser performance may be reduced unless the actuators 24a, 25a are not adjusted with high accuracy so that the reflection surface of the rear mirror 24 and the reflection surface of the front mirror 25 become parallel to each other.

FIG. 4 shows the center axis C of the optical resonator perpendicular to the reflection surface of the rear mirror 24 and the reflection surface of the front mirror 25. When the reflection surface of the rear mirror 24 and the reflection surface of the front mirror 25 are non-perpendicular to the optical path axis of the laser light B1, the optical path axis changes in the order of B11a, B12a, and B13a as the laser light reciprocates between the rear mirror 24 and the front mirror 25. When the optical path axis deviates from the discharge space as the optical path axis B13a, the amplification efficiency of the laser light is reduced. Further, when shift of the optical path axis occurs every time the laser light reciprocates between the rear mirror 24 and the front mirror 25, the beam profile and the beam divergence of the amplified laser light B2 output from the power oscillator PO are not ideal. Therefore, the laser performance may be reduced unless the actuators 31a, 32a (see FIG. 1) are not adjusted with high accuracy so that the reflection surface of the rear mirror 24 and the reflection surface of the front mirror 25 become perpendicular to the optical path axis of the laser light B1.

2. Gas Laser Device with Rear Mirror 24b and Front Mirror 25b being Confocal Resonator

2.1 Configuration

Figure 5:
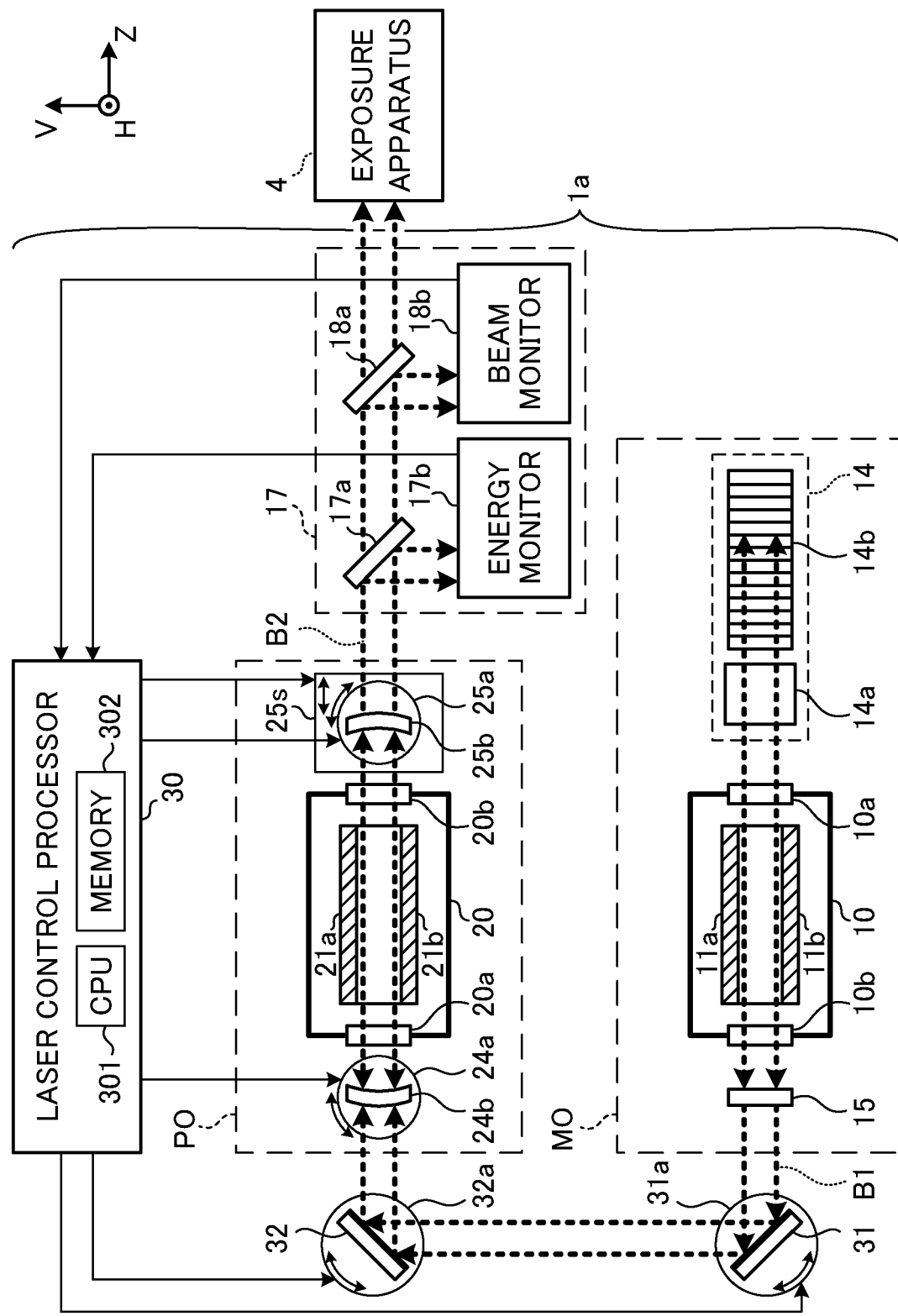
FIG. 5 schematically shows the configuration of the gas laser device in a first embodiment.

FIG. 5 schematically shows the configuration of a gas laser device 1a of a first embodiment. The gas laser device 1a includes a rear mirror 24b and a front mirror 25b instead of the rear mirror 24 and the front mirror 25 in the gas laser device 1 shown in FIG. 1. Further, the front mirror 25b is configured to be movable in the Z-axis direction by a linear stage 25s. By moving the front mirror 25b in the Z-axis direction, the distance between the rear mirror 24b and the front mirror 25b is adjusted. The linear stage 25s corresponds to a resonator length adjustment mechanism in the present disclosure.

The beam monitor 18b is configured to measure beam divergence in addition to the beam profile of the amplified laser light B2. A specific configuration of the beam monitor 18b will be described later with reference to FIG. 18.

Figure 6:
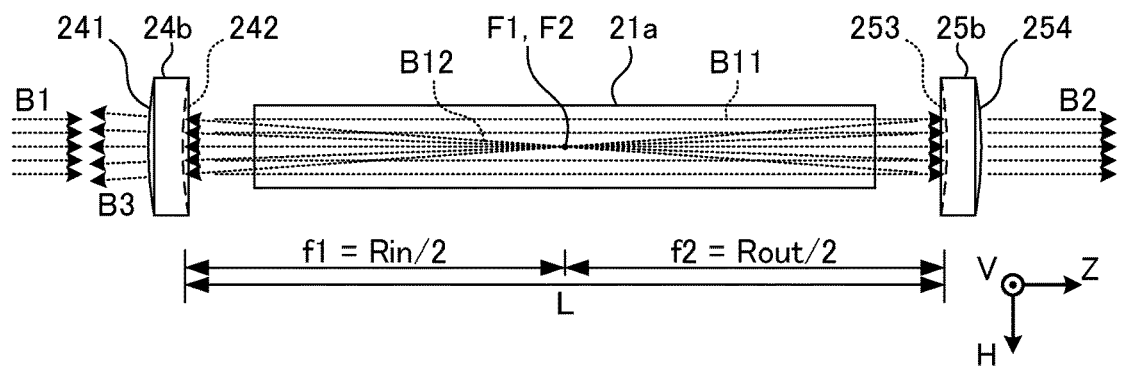
FIG. 6 shows an optical resonator configuring the power oscillator of the first embodiment.
Figure 7:
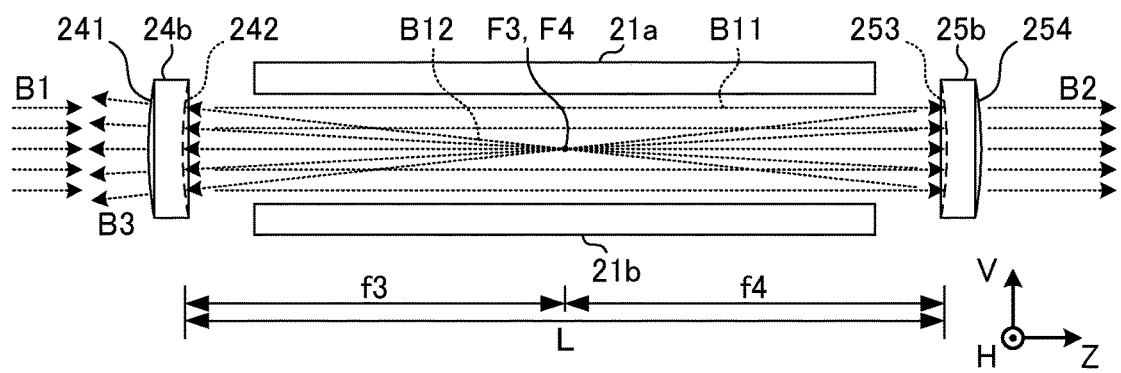
FIG. 7 shows the optical resonator configuring the power oscillator of the first embodiment.

FIGS. 6 and 7 show an optical resonator configuring the power oscillator PO in the first embodiment. FIG. 6 is a view viewing the optical resonator in the V-axis direction, and FIG. 7 is a view viewing the optical resonator in the H-axis direction.

The rear mirror 24b has a first surface 241 and a second surface 242 through which the laser light B1 is transmitted. The second surface 242 faces the discharge chamber 20. The first surface 241 is coated with a reflection-reducing film and the second surface 242 is coated with a partial reflection film. The reflectance of the rear mirror 24b is, for example, about 80%.

The first surface 241 is a convex surface and the second surface 242 is a concave surface. The first surface 241 and the second surface 242 are spherical, and a focal length f1 from the second surface 242 to a focal point F1 of the rear mirror 24b in the H-axis direction is equal to a focal length f3 from the second surface 242 to a focal point F3 of the rear mirror 24b in the V-axis direction. The focal point F1 corresponds to the first focal point in the present disclosure.

Since the first surface 241 and the second surface 242 have the same curvature radius Rin, the wavefront of the light transmitted through the rear mirror 24b does not change.

The front mirror 25b has a third surface 253 and a fourth surface 254 through which a part of the laser light transmitted through the rear mirror 24b is transmitted. The third surface 253 faces the discharge chamber 20. The third surface 253 is coated with a partial reflection film, and the fourth surface 254 is coated with a reflection-reducing film. The reflectance of the front mirror 25b is, for example, 10% or more and 20% or less.

The third surface 253 is concave and the fourth surface 254 is convex. The third surface 253 and the fourth surface 254 are spherical, and a focal length f2 from the third surface 253 to a focal point F2 of the front mirror 25b in the H-axis direction is equal to a focal length f4 from the third surface 253 to a focal point F4 of the front mirror 25b in the V-axis direction. The focal point F2 corresponds to the second focal point in the present disclosure.

Since the third surface 253 and the fourth surface 254 have the same curvature radius Rout, the wavefront of the light transmitted through the front mirror 25b does not change.

The focal point F1 of the rear mirror 24b in the H-axis direction and the focal point F2 of the front mirror 25b in the H-axis direction coincide with each other at a position between the rear mirror 24b and the front mirror 25b. That is, the sum of the focal lengths f1, f2 coincides with a resonator length L.

Coincidence with the resonator length L includes a case in which the difference from the resonator length L is 2% or less of the resonator length L. That is, the sum of the focal lengths f1, f2 may satisfy the following equation.

$$0.98 \times L \leq f1 + f2 \leq 1.02 \times L$$

The relationship between the resonator length L and the sum of the curvature radius Rin of the second surface 242 in the H-axis direction and the curvature radius Rout of the third surface 253 in the H-axis direction is as follows.

$$0.98 \times L \leq (Rin+Rout)/2 \leq 1.02 \times L$$

When the focal lengths f1, f2 are equal to each other, each of the focal lengths f1, f2 is half of the resonator length L, so that each of the curvature radius Rin of the second surface 242 in the H-axis direction and the curvature radius Rout of the third surface 253 in the H-axis direction coincide with the resonator length L.

2.2 Operation

When the laser light B1 is parallel light, the laser light B1 becomes laser light B11 being parallel light after being transmitted through the rear mirror 24b in the +Z direction. When a part of the laser light B11 is reflected by the third surface 253 in the −Z direction, the part is concentrated on the focal point F2 as laser light B12, and thereafter, the laser light B12 travels to the rear mirror 24b while the beam diameter thereof is expanded.

A part of the laser light B12 incident on the rear mirror 24b in the −Z direction is reflected by the second surface 242 in the +Z direction, and the optical path of the reflection light coincides with the optical path of the laser light B11. In this way, the laser light B11, B12 reciprocates in the optical resonator, and a part of the amplified laser light B11 is transmitted through the front mirror 25b and becomes the amplified laser light B2 being parallel light. The laser light B1 entering the optical resonator may include different wavelengths in the H-axis direction due to spectral diffraction by the line narrowing module 14. However, since the beam profile of the laser light B11, B12 reciprocating in the optical resonator is reversed every time the laser light is concentrated on the focal point F2, the amplified laser light B2 having a small deviation in wavelength in the H-axis direction is output from the front mirror 25b.

The other part of the laser light B12 incident on the rear mirror 24b in the −Z direction is transmitted through the second surface 242 and becomes return light B3. However, since the return light B3 travels while the beam diameter thereof is expanded as well as the laser light B12, adverse effects such as heating of the optical elements such as the line narrowing module 14 are suppressed.

When the relative positions between the focal points F1, F2 are shifted, the beam divergence of the amplified laser light B2 changes. That is, even when the laser light B1 is parallel light, the amplified laser light B2 becomes non-parallel light. Therefore, the laser control processor 30 controls the linear stage 25s based on the measurement result of the beam divergence by the beam monitor 18b.

2.3 Effect

According to the first embodiment, the focal points F1, F2 coincide with each other at a position between the rear mirror 24b and the front mirror 25b. Thus, the rear mirror 24b and the front mirror 25b configure the confocal resonator. Accordingly, even when the posture of either the rear mirror 24b or the front mirror 25b is changed or the optical path axis of the laser light B1 is changed, it is possible to suppress a reduction in the amplification efficiency and a change in the beam profile and the beam divergence of the amplified laser light B2.

According to the first embodiment, the first surface 241 of the rear mirror 24b is convex and the second surface 242 thereof is concave. Accordingly, the wavefront of the laser light when being transmitted through the rear mirror 24b is suppressed from changing. Further, since the return light B3 travels while the beam diameter thereof is expanded, adverse effects such as the heating of the optical elements included in the master oscillator MO are suppressed.

According to the first embodiment, the first surface 241 and the second surface 242 have the same curvature radius Rin. Accordingly, the wavefront of the laser light when being transmitted through the rear mirror 24b is suppressed from changing.

According to the first embodiment, the third surface 253 of the front mirror 25b is concave and the fourth surface 254 thereof is convex. Further, the third surface 253 and the fourth surface 254 have the same curvature radius Rout. Accordingly, the wavefront of the laser light when being transmitted through the front mirror 25b is suppressed from changing.

According to the first embodiment, the curvature radii Rin, Rout of the second surface 242 and the third surface in the H-axis direction coincide with the resonator length L. Accordingly, the optical path of the light reciprocating between the rear mirror 24b and the front mirror 25b is suppressed from changing between the first reciprocation and the second reciprocation or later.

According to the first embodiment, the laser control processor 30 adjusts the resonator length L based on the measurement result of the beam divergence of the amplified laser light B2. Accordingly, even when the curvature radii Rin, Rout fluctuate due to heating of the rear mirror 24b and the front mirror 25b or the like, the quality of the amplified laser light B2 can be maintained.

In other respects, the first embodiment is similar to the comparative example.

Figure 8:
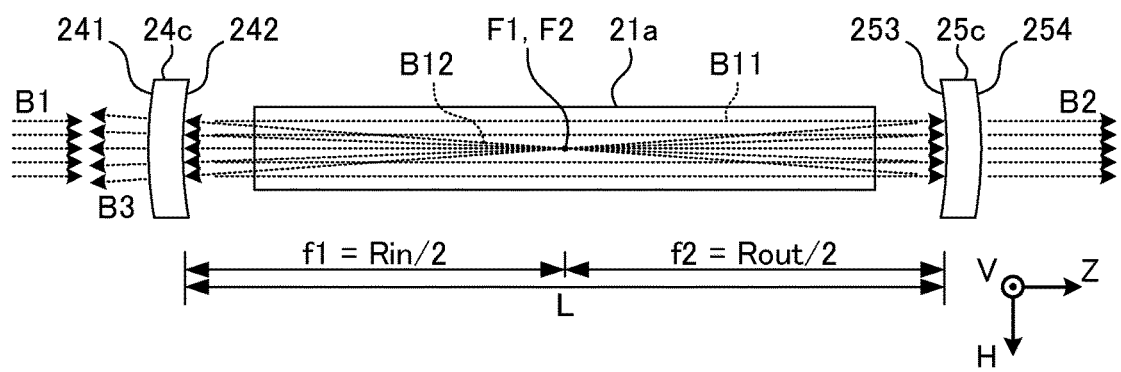
FIG. 8 shows an optical resonator configuring the power oscillator of a second embodiment.
Figure 9:
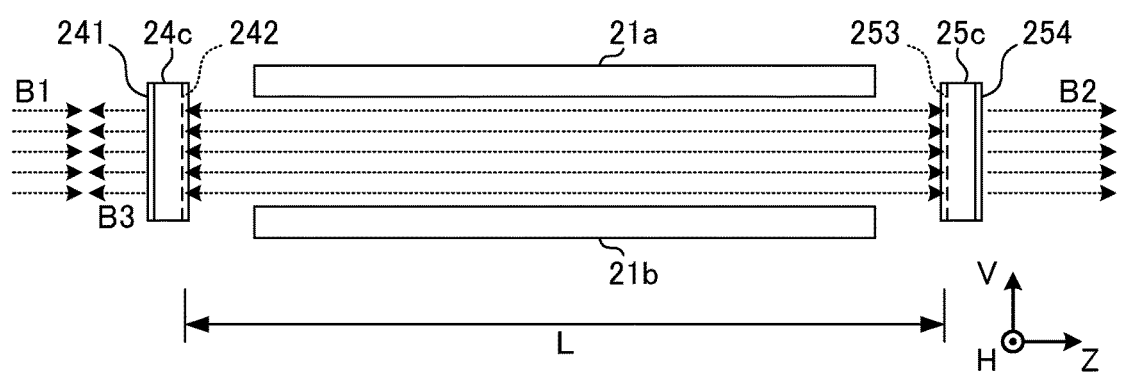
FIG. 9 shows the optical resonator configuring the power oscillator of the second embodiment.

3. Gas Laser Device in which Each of Rear Mirror 24c and Front Mirror 25c Includes Cylindrical Lens 3.1 Configuration FIGS. 8 and 9 show an optical resonator configuring the power oscillator PO in a second embodiment. FIG. 8 is a view viewing the optical resonator in the V-axis direction, and FIG. 9 is a view viewing the optical resonator in the H-axis direction.

In the second embodiment, each of the rear mirror 24c and the front mirror 25c is configured by a cylindrical lens having a curvature in the H-axis direction and not having a curvature in the V-axis direction. The first surface 241 and the second surface 242 of the rear mirror 24c have the same curvature radius Rin in the H-axis direction. The third surface 253 and the fourth surface 254 of the front mirror 25c have the same curvature radius Rout in the H-axis direction.

3.2 Operation

As shown in FIG. 8, the laser light is concentrated in the H-axis direction every time the laser light reciprocates between the rear mirror 24c and the front mirror 25c. On the other hand, as shown in FIG. 9, the laser light is not concentrated in the V-axis direction, and reciprocates between the rear mirror 24c and the front mirror 25c while being as parallel light.

3.3 Effect

To configure the confocal resonator with the spherical mirror as in the first embodiment, the curvature radii in the H-axis direction and the V-axis direction need to be processed with high accuracy, but the positional shift of the focal points F1 to F4 may be caused due to manufacturing tolerances, which may adversely affect the beam divergence. The shift in the V-axis direction having a larger beam width is more particularly affected than the shift in the H-axis direction. According to the second embodiment, each of the rear mirror 24c and the front mirror 25c includes a cylindrical lens having a curvature in the H-axis direction. Absence of curvature in the V-axis direction can reduce the adverse effects on the beam divergence due to manufacturing tolerances of the rear mirror 24c and the front mirror 25c.

In other respects, the second embodiment is similar to the first embodiment.

4. Gas Laser Device Including Beam Expander 23 on Optical Path of Laser Light B1

4.1 Configuration

Figure 10:
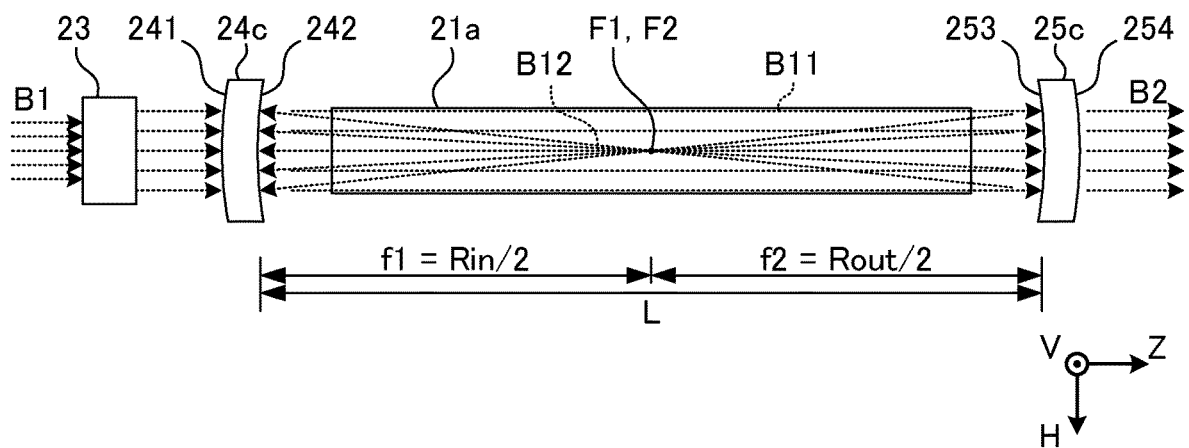
FIG. 10 shows the optical resonator configuring the power oscillator of a third embodiment.

FIG. 10 shows an optical resonator configuring the power oscillator PO in a third embodiment. FIG. 10 is a view viewing the optical resonator in the V-axis direction.

In the third embodiment, a beam expander 23 is arranged on the optical path of the laser light B1 to be incident on the rear mirror 24c. The beam expander 23 causes the laser light B1 being parallel light having a beam width expanded at least in the H-axis direction to be incident on the rear mirror 24c. The beam width of the laser light B1 expanded by the beam expander 23 preferably coincides with the width of the discharge space corresponding to the width of the electrodes 21a, 21b in the H-axis direction. For example, when the beam width of the laser light B1 entering the beam expander 23 is 1.5 mm and the width of the discharge space is 3 mm, the beam width magnification by the beam expander 23 may be two.

4.2 Effect

According to the third embodiment, by increasing the beam width of the laser light B1 incident on the rear mirror 24c, energy density on the rear mirror 24c and the front mirror 25c is reduced, so that lifetime thereof can be extended. Further, by causing the beam width of the laser light B1 incident on the rear mirror 24c to coincide with the width of the discharge space, the amplification efficiency can be improved.

In other respects, the third embodiment is similar to the second embodiment. Alternatively, in the third embodiment, the rear mirror 24b and the front mirror 25b each having a spherical surface may be used as in the first embodiment.

Figure 11:
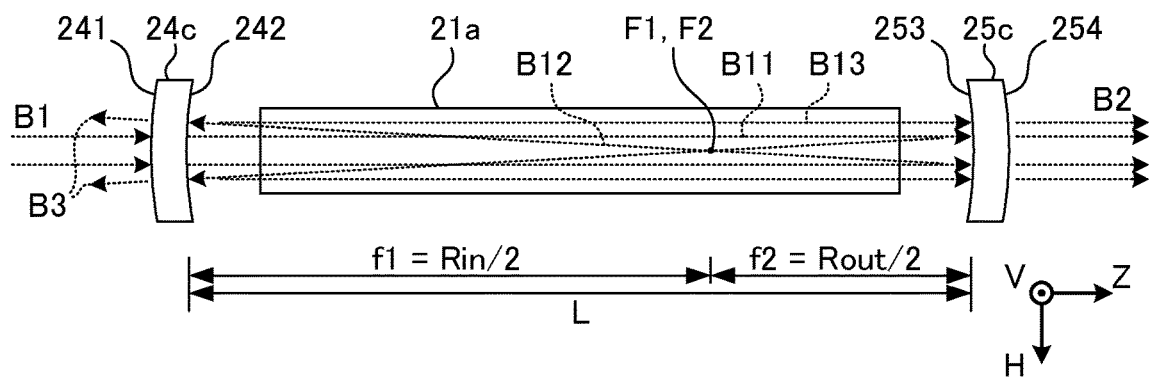
FIG. 11 shows the optical resonator configuring the power oscillator of a fourth embodiment.

5. Gas Laser Device in which Curvature Radius Rin of Rear Mirror 24c and Curvature Radius Rout of Front Mirror 25c are Different 5.1 Configuration FIG. 11 shows an optical resonator configuring the power oscillator PO in a fourth embodiment. FIG. 11 is a view viewing the optical resonator in the V-axis direction.

In the fourth embodiment, the curvature radius Rin of the second surface 242 in the H-axis direction is larger than the curvature radius Rout of the third surface 253 in the H-axis direction. Each of the curvature radii Rin, Rout may not coincide with the resonator length L. For example, the curvature radius Rin is set to 102% or more and 110% or less of the resonator length L, and the curvature radius Rout is set to 90% or more and 98% or less of the resonator length L. Here, the focal point F1 of the rear mirror 24c in the H-axis direction and the focal point F2 of the front mirror 25c in the H-axis direction coincide with each other at a position between the rear mirror 24b and the front mirror 25c. That is, the sum of the focal lengths f1, f2 coincides with the resonator length L.

5.2 Operation

When the laser light B1 is parallel light, the laser light B1 becomes the laser light B11 being parallel light after passing through the rear mirror 24c in the +Z direction. When a part of the laser light B11 is reflected by the third surface 253 in the −Z direction, the part is concentrated on the focal point F2 as the laser light B12, and thereafter, the laser light B12 travels to the rear mirror 24c while the beam diameter thereof is expanded.

A part of the laser light B12 incident on the rear mirror 24c is reflected by the second surface 242 in the +Z direction, and becomes laser light B13 being parallel light. At this time, the beam width of the laser light B13 in the H-axis direction is larger than the beam width of the laser light B11 in the H-axis direction. In this manner, each time the laser light reciprocates between the rear mirror 24c and the front mirror 25c, the beam width of the laser light incident on the front mirror 25c becomes large.

Figure 12:
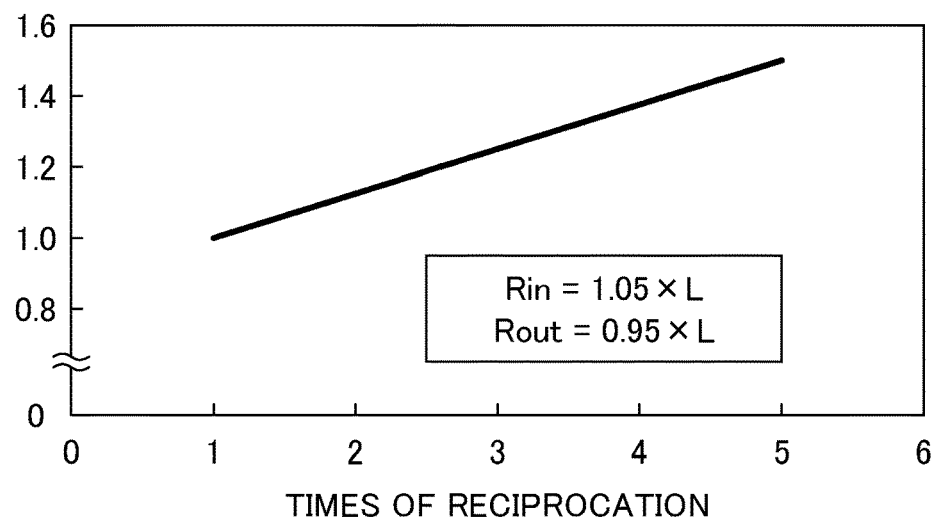
FIG. 12 is a graph showing a result of simulation of a beam width of the laser light reciprocating in the optical resonator in the fourth embodiment.

FIG. 12 is a graph showing a result of simulation of the beam width of the laser light reciprocating in the optical resonator in the fourth embodiment. In FIG. 12, the curvature radius Rin of the rear mirror 24c is 1.05 times the resonator length L, and the curvature radius Rout of the front mirror 25c is 0.95 times the resonator length L. As shown in FIG. 12, the beam width becomes large each time the laser light reciprocates in the optical resonator. A part of the amplified light is output as the amplified laser light B2.

5.3 Effect

According to the fourth embodiment, the curvature radius Rin of the rear mirror 24c is larger than the curvature radius Rout of the front mirror 25c. Accordingly, each time the laser light reciprocates between the rear mirror 24c and the front mirror 25c, the beam width becomes large and the energy density on the rear mirror 24c and the front mirror 25c is reduced, so that lifetime of these mirrors can be extended.

According to the fourth embodiment, the curvature radius Rin of the rear mirror 24c is set to 102% or more and 110% or less of the resonator length L, and the curvature radius Rout of the front mirror 25c is set to 90% or more and 98% or less of the resonator length L. Accordingly, the beam width when the laser light is sufficiently amplified by reciprocating 3 to 5 times in the optical resonator can be set to an appropriate size.

In other respects, the fourth embodiment is similar to the second embodiment. Alternatively, in the fourth embodiment, the rear mirror 24b and the front mirror 25b each having a spherical surface may be used as in the first embodiment.

Figure 13:
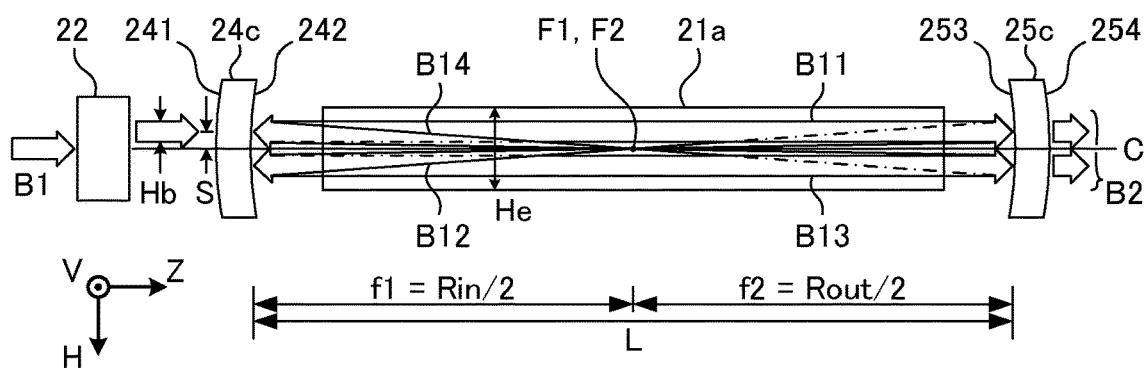
FIG. 13 shows the optical resonator configuring the power oscillator of a fifth embodiment.

6. Gas Laser Device Causing Laser Light B1 to be Incident on Position Shifted in H-Axis Direction from Center Axis C of Optical Resonator 6.1 Configuration FIG. 13 shows an optical resonator configuring the power oscillator PO in the fifth embodiment. FIG. 13 is a view viewing the optical resonator in the V-axis direction.

In the fifth embodiment, an optical path adjustment mechanism 22 is arranged on the optical path of the laser light B1 between the master oscillator MO and the power oscillator PO. The optical path adjustment mechanism 22 adjusts the optical path of the laser light B1 so that the laser light B1 is incident on the rear mirror 24c at a position shifted in the H-axis direction with respect to the center axis C of the optical resonator. The distance S between the center axis C and the incident position of the laser light B1 is preferably within the following range.

$$(He-Hb)/4 \leq S \leq (He-Hb)/2$$

Here, He is the width of the electrode 21a in the H-axis direction and Hb is the beam width of the laser light B1 in the H-axis direction.

Alternatively, the spread angle of the laser light B1 and the resonator length L may be further considered. For example, the distance S may be equal to or more than 0.50 mm and equal to or less than 0.75 mm, where the width He of the electrode 21a in the H-axis direction is 3 mm, the beam width Hb of the laser light B1 in the H-axis direction is 1.5 mm, the spread angle of the laser light B1 is 0.5 mrad, and the resonator length L is 1 m.

Figure 14:
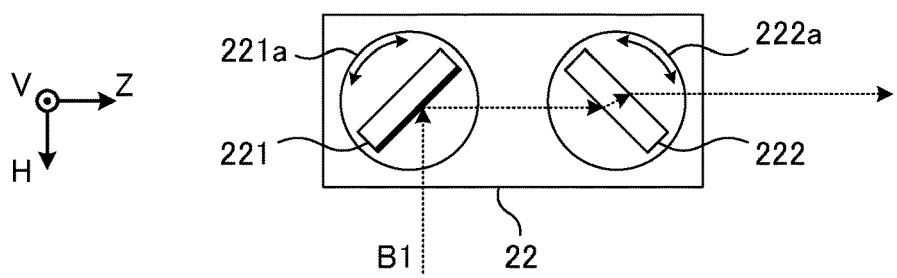
FIG. 14 schematically shows a first example of an optical path adjustment mechanism.

FIG. 14 schematically shows a first example of the optical path adjustment mechanism 22. The optical path adjustment mechanism 22 may include a high reflection mirror 221 and a plane-parallel substrate 222. The high reflection mirror 221 may also serve as the high reflection mirror 32 configuring the beam steering unit. The plane-parallel substrate 222 is made of a material that transmits the laser light B1. The high reflection mirror 221 and the plane-parallel substrate 222 are rotatable about an axis parallel to the V axis by actuators 221a, 222a, respectively.

By adjusting the posture of the plane-parallel substrate 222 by the actuator 222a, the position of the laser light B1 to be incident on the rear mirror 24c in the H-axis direction can be adjusted.

By adjusting the posture of the high reflection mirror 221 by the actuator 221a, the incident direction of the laser light B1 to be incident on the rear mirror 24c can be adjusted in the HZ plane.

Figure 15:
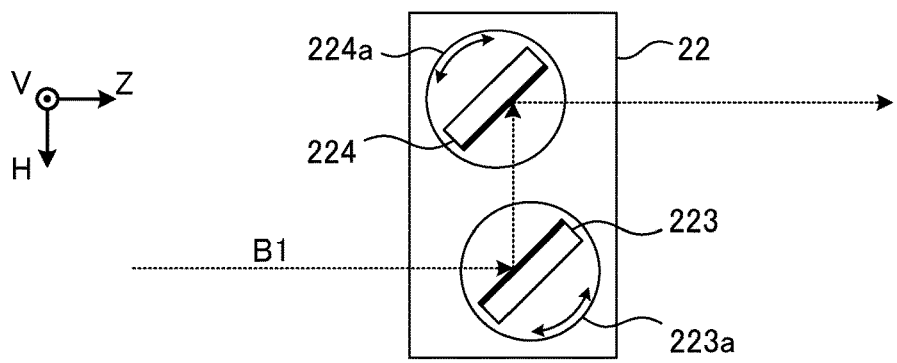
FIG. 15 schematically shows a second example of the optical path adjustment mechanism.

FIG. 15 schematically shows a second example of the optical path adjustment mechanism 22. The optical path adjustment mechanism 22 may include high reflection mirrors 223, 224. The high reflection mirrors 223, 224 may also serve as the high reflection mirrors 31, 32 configuring the beam steering unit. The high reflection mirrors 223, 224 are rotatable about an axis parallel to the V axis by actuators 223a, 224a, respectively.

By adjusting the postures of the high reflection mirrors 223, 224 by the actuators 223a, 224a, the position of the laser light B1 incident on the rear mirror 24c in the H-axis direction and the incident direction of the laser light B1 can be adjusted.

6.2 Operation

Referring back to FIG. 13, when the laser light B1 shifted in the −H direction with respect to the center axis C is transmitted through the rear mirror 24c in the +Z direction, the laser light B11 shifted in the −H direction with respect to the center axis C is obtained. A part of the laser light B11 is reflected by the third surface 253 in the −Z direction and is concentrated on the focal point F2 as the laser light B12, and thereafter, the laser light B12 is incident on the rear mirror 24c through an optical path shifted in the +H direction with respect to the center axis C.

A part of the laser light B12 incident on the rear mirror 24c is reflected by the second surface 242 in the +Z direction, and becomes the laser light B13 shifted in the +H direction with respect to the center axis C. A part of the laser light B13 is reflected by the third surface 253 in the −Z direction and is concentrated on the focal point F2 as laser light B14, and thereafter, the laser light B14 is incident on the rear mirror 24c through an optical path shifted in the −H direction with respect to the center axis C.

A part of the laser light B14 incident on the rear mirror 24c is reflected by the second surface 242 in the +Z direction, and the optical path of the reflection light coincides with the optical path of the laser light B11. In this way, the laser light B11 to B14 reciprocates in the optical reso-nator, and a part of the amplified laser light B11 and a part of the amplified laser light B13 are transmitted through the front mirror 25c and becomes the amplified laser light B2.

By adjusting the distance S between the center axis C and the incident position of the laser light B1, the beam width and the energy density of the amplified laser light B2 change. The laser control processor 30 may control the optical path adjustment mechanism 22 based on the beam width measured by the beam monitor 18b or the energy density calculated from the measurement result of the energy monitor 17b and the beam monitor 18b.

6.3 Effect

According to the fifth embodiment, the laser light B1 is incident on the rear mirror 24c at a position shifted in the H-axis direction with respect to the center axis C of the optical resonator. Accordingly, in the optical resonator configuring the confocal resonator, amplification is performed while the optical path is changed between the position shifted in the −H direction and the position shifted in the +H direction. Accordingly, energy density at the rear mirror 24c and the front mirror 25c is reduced, so that lifetime thereof can be extended.

According to the fifth embodiment, the distance S between the center axis C of the optical resonator and the incident position of the laser light B1 is equal to or more than (He−Hb)/4 and equal to or less than (He−Hb)/2. Accordingly, the laser light reciprocating in the optical resonator is caused to pass through the discharge space, so that the laser light can be efficiently amplified.

According to the fifth embodiment, the laser control processor 30 controls the optical path adjustment mechanism 22 based on the beam width or the energy density of the amplified laser light B2. Accordingly, the beam width or the energy density of the amplified laser light B2 can be adjusted to an appropriate value.

In other respects, the fifth embodiment is similar to the second embodiment. Alternatively, in the fifth embodiment, the rear mirror 24b and the front mirror 25b each having a spherical surface may be used as in the first embodiment.

Figure 16:
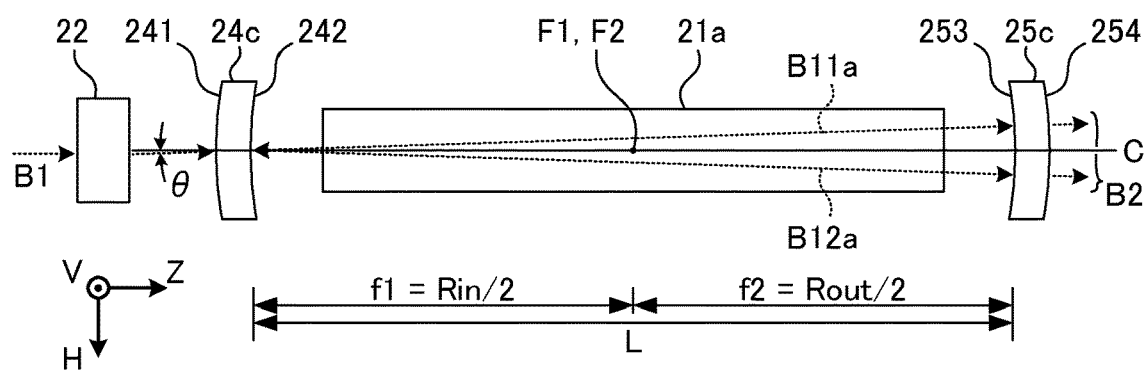
FIG. 16 shows an optical resonator configuring the power oscillator of a sixth embodiment.

7. Gas Laser Device Causing Laser Light B1 to be Incident at Angle Shifted in H-Axis Direction with Respect to Center Axis C of Optical Resonator 7.1 Configuration FIG. 16 shows an optical resonator configuring the power oscillator PO in a sixth embodiment. FIG. 16 is a view viewing the optical resonator in the V-axis direction.

In the sixth embodiment, the optical path adjustment mechanism 22 is arranged on the optical path of the laser light B1 incident on the rear mirror 24c. The optical path adjustment mechanism 22 adjusts the optical path of the laser light B1 so that the laser light B1 is incident on the rear mirror 24c at an angle shifted in the H-axis direction with respect to the center axis C of the optical resonator. When the center axis C is parallel to the Z axis, the angle θ shifted in the H-axis direction with respect to the center axis C may be an angle θ around an axis parallel to the V axis.

For example, the angle θ between the center axis C and the incident direction of the laser light B1 is preferably within a range of 0.2 mrad or more and 0.8 mrad or less, where the width He of the electrode 21a in the H-axis direction is 3 mm, the beam width Hb of the laser light B1 in the H-axis direction is 1.5 mm, the spread angle of the laser light B1 is 0.5 mrad, and the resonator length L is 1 m. For example, the angle θ may be 0.5 mrad. When the curvature of the first surface 241 is different from the curvature of the second surface 242, the angle C is corrected in accordance with the curvatures.

An example of the optical path adjustment mechanism 22 may be similar to that described with reference to FIG. 14 or FIG. 15.

7.2 Operation

When the laser light B1 is transmitted through the rear mirror 24c in the +Z direction at the angle θ shifted in the +H direction with respect to the center axis C, the laser light is incident on the front mirror 25c through the optical path axis B11a. When a part of the laser light incident on the front mirror 25c through the optical path axis B11a is reflected by the third surface 253 in the −Z direction, the reflection light is once concentrated through the optical path axis B11a in the opposite direction, and then, is incident on the rear mirror 24c.

A part of the laser light incident on the rear mirror 24c through the optical path axis B11a is reflected by the second surface 242 in the +Z direction, and is incident on the front mirror 25c through the optical path axis B12a. When a part of the laser light incident on the front mirror 25c through the optical path axis B12a is reflected by the third surface 253 in the −Z direction, the reflection light is once concentrated through the optical path axis B12a in the opposite direction, and then, is incident on the rear mirror 24c.

A part of the laser light incident on the rear mirror 24c through the optical path axis B12a is reflected by the second surface 242 in the +Z direction, and the reflection light is incident again on the front mirror 25c through the optical path axis B11a. In this way, the laser light reciprocates in the optical resonator, and a part of the amplified laser light is transmitted through the front mirror 25c and becomes the amplified laser light B2.

By adjusting the angle θ between the center axis C and the incident direction of the laser light B1, the beam width and the energy density of the amplified laser light B2 change. The laser control processor 30 may control the optical path adjustment mechanism 22 based on the beam width measured by the beam monitor 18b or the energy density calculated from the measurement result of the energy monitor 17b and the beam monitor 18b.

7.3 Effect

According to the sixth embodiment, the laser light B1 is incident on the rear mirror 24c at the angle θ shifted in the H-axis direction with respect to the center axis C of the optical resonator. Accordingly, in the optical resonator configuring the confocal resonator, amplification is performed while the optical path is changed between the position shifted in the −H direction and the position shifted in the +H direction. Accordingly, energy density at the front mirror 25c is reduced, so that lifetime thereof can be extended.

According to the sixth embodiment, the angle θ between the center axis C and the incident direction of the laser light B1 is equal to or more than 0.2 mrad and equal to or less than 0.8 mrad. Accordingly, the laser light reciprocating in the optical resonator is caused to pass through the discharge space, so that the laser light can be efficiently amplified.

According to the sixth embodiment, the laser control processor 30 controls the optical path adjustment mechanism 22 based on the beam width or the energy density of the amplified laser light B2. Accordingly, the beam width or the energy density of the amplified laser light B2 can be adjusted to an appropriate value.

In other respects, the sixth embodiment is similar to the second embodiment. Alternatively, in the sixth embodiment, the rear mirror 24b and the front mirror 25b each having a spherical surface may be used as in the first embodiment.

Figure 17:
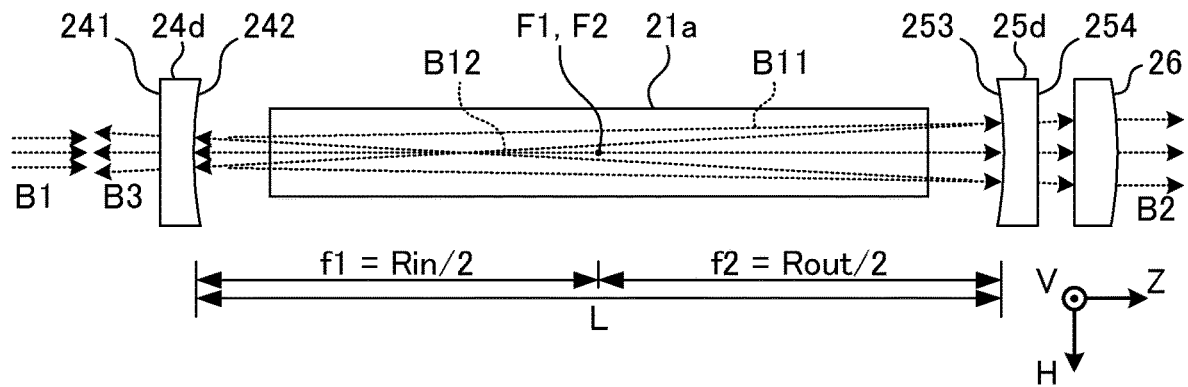
FIG. 17 shows an optical resonator configuring the power oscillator of a seventh embodiment.

8. Gas Laser Device in which Rear Mirror 24d and Front Mirror 25d Each Include Planoconcave Lens 8.1 Configuration FIG. 17 shows an optical resonator configuring the power oscillator PO in a seventh embodiment. FIG. 17 is a view viewing the optical resonator in the V-axis direction.

In the seventh embodiment, the rear mirror 24d is configured by a planoconcave lens in which the first surface 241 is a planar surface and the second surface 242 is a concave surface. The first surface 241 is coated with a reflection-reducing film and the second surface 242 is coated with a partial reflection film.

The front mirror 25d is configured by a planoconcave lens in which the third surface 253 that is a concave surface and the fourth surface 254 is a planar surface. The third surface 253 is coated with a partial reflection film, and the fourth surface 254 is coated with a reflection-reducing film.

A convex lens 26 is arranged on the optical path of the amplified laser light B2 output from the front mirror 25d. When the rear mirror 24d and the front mirror 25d are cylindrical lenses each having a curvature in the H-axis direction, the convex lens 26 is also a cylindrical lens having a curvature in the H-axis direction. Both surfaces of the convex lens 26 are each coated with a reflection-reducing film. The convex lens 26 may be arranged on the optical path of the laser light B1.

8.2 Operation

When the laser light B1 is parallel light, the laser light B1 becomes the laser light B11 having wavefront convex frontward after being transmitted through the rear mirror 24d in the +Z direction. When a part of the laser light B11 is reflected by the third surface 253 in the −Z direction, the part is concentrated as the laser light B12 at a position between the focal point F2 and the rear mirror 24d, and then, the laser light B12 is incident on the rear mirror 24d.

A part of the laser light B12 incident on the rear mirror 24d is reflected by the second surface 242 in the +Z direction, and the optical path of the reflection light coincides with the optical path of the laser light B11. In this way, the laser light B11, B12 reciprocates in the optical resonator, and a part of the amplified laser light is transmitted through the front mirror 25d and becomes the amplified laser light B2. The change in the wavefront when being transmitted through the rear mirror 24d and the front mirror 25d is canceled by the convex lens 26.

8.3 Effect

According to the seventh embodiment, the first surface 241 of the rear mirror 24d is a planar surface, the second surface 242 is a concave surface, and the reflectance of the second surface 242 is higher than that of the first surface 241. Accordingly, since the rear mirror 24d is configured by a planoconcave lens, it is possible to reduce the difficulty of manufacturing. Further, since the laser light transmitted through the rear mirror 24d is incident on the front mirror 25d while spreading, energy density at the front mirror 25d is reduced and lifetime of the front mirror 25d can be extended.

According to the seventh embodiment, the third surface 253 of the front mirror 25d is a concave surface, the fourth surface 254 is a planar surface, and the reflectance of the third surface 253 is higher than that of the fourth surface 254. Accordingly, since the front mirror 25d is configured by a planoconcave lens, it is possible to reduce the difficulty of manufacturing.

According to the seventh embodiment, the convex lens 26 is arranged to cancel the change in the wavefront when the laser light is transmitted through the second surface 242 and the third surface 253. Accordingly, the beam divergence of the amplified laser light B2 can be set to be equal to or less than an allowable value.

In other respects, the seventh embodiment is similar to the second embodiment. Alternatively, in the seventh embodiment, the rear mirror 24b and the front mirror 25b each having a spherical surface may be used as in the first embodiment. When the rear mirror 24d and the front mirror 25d are spherical, the convex lens 26 is spherical.

9. Example of Beam Monitor 18b

9.1 Configuration

Figure 18:
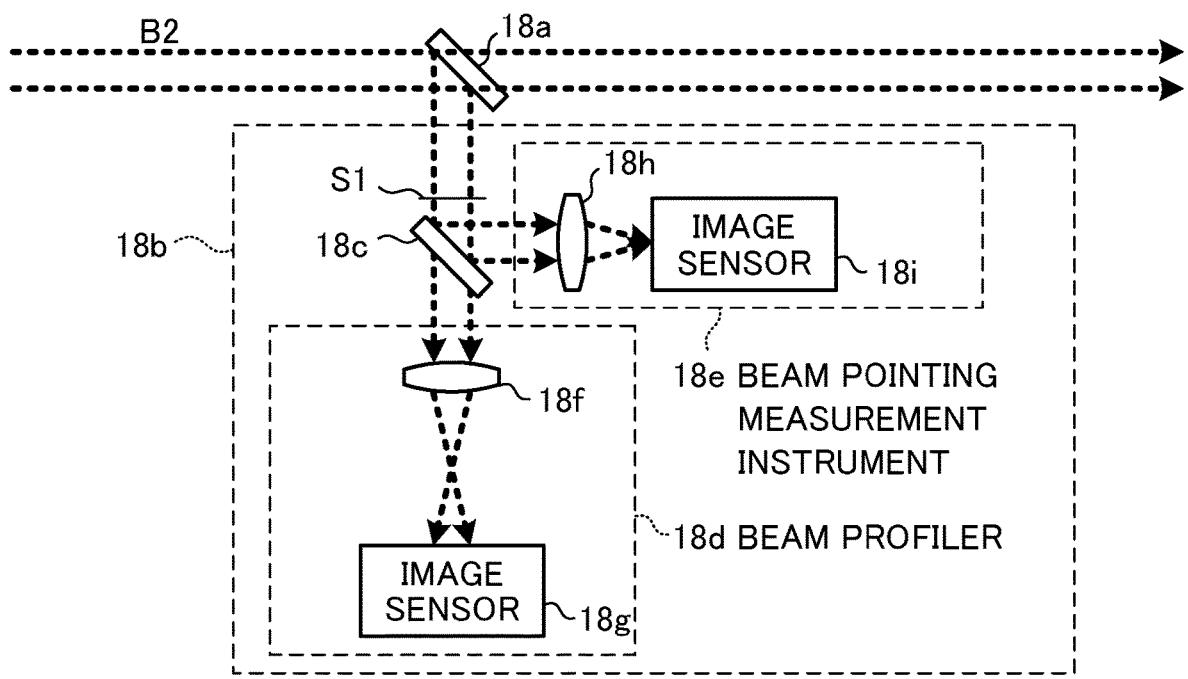
FIG. 18 shows a specific configuration of a beam monitor usable for each embodiment.

FIG. 18 shows a specific configuration of the beam monitor 18b usable for each embodiment. The beam monitor 18b includes a beam splitter 18c, a beam profiler 18d, and a beam pointing measurement instrument 18e.

The beam splitter 18c is configured to transmit a part of the amplified laser light B2 incident on the beam monitor 18b and reflect another part thereof. The beam profiler 18d is arranged on one of the optical paths of the laser light branched by the beam splitter 18c, and the beam pointing measurement instrument 18e is arranged on the other thereof. The beam profiler 18d includes a transfer optical system 18f and an image sensor 18g. The beam pointing measurement instrument 18e includes a light concentrating optical system 18h and an image sensor 18i.

9.2 Operation

In the beam profiler 18d, the transfer optical system 18f forms an image of a cross section S1 of the optical path of the laser light on a light receiving surface of the image sensor 18g.

The image sensor 18g generates image data of the cross section S1 received via the transfer optical system 18f, and transmits the image data to the laser control processor 30. The beam profile is obtained from the image data of the cross section S1.

In the beam pointing measurement instrument 18e, the light concentrating optical system 18h concentrates the laser light on the light receiving surface of the image sensor 18i.

The image sensor 18i generates image data of the concentration point of the laser light received via the light concentrating optical system 18h, and transmits the image data to the laser control processor 30. The laser control processor 30 calculates the beam pointing of the laser light based on the image data of the concentration point of the laser light. The beam pointing is calculated based on the positional relationship between the reference position of the light receiving surface of the image sensor 18i and the concentration position of the laser light. Further, the laser control processor 30 calculates the absolute value Bd of the beam divergence of the laser light based on the image data of the concentration point of the laser light. The absolute value Bd of the beam divergence can be calculated by the following equation using a spot diameter Sp of the concentrated laser light and a focal length f of the light concentrating optical system 18h.

$$Bd = Sp/f$$

10. Others

Figure 19:
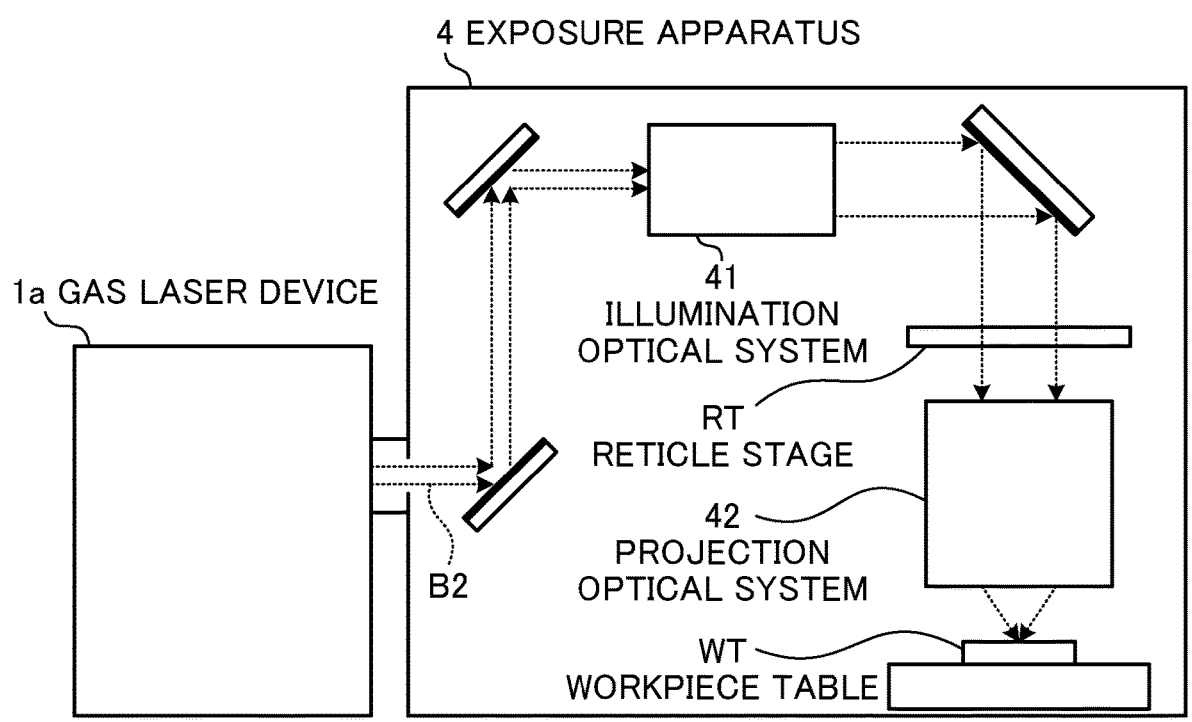
FIG. 19 schematically shows the configuration of an exposure apparatus connected to the gas laser device.

FIG. 19 schematically shows the configuration of the exposure apparatus 4 connected to the gas laser device 1a. The gas laser device 1a generates the amplified laser light B2 and outputs the amplified laser light B2 to the exposure apparatus 4.

In FIG. 19, the exposure apparatus 4 includes an illumination optical system 41 and a projection optical system 42. The illumination optical system 41 illuminates a reticle pattern of a reticle (not shown) arranged on a reticle stage RT with the amplified laser light B2 having entered from the gas laser device 1a. The projection optical system 42 causes the amplified laser light B2 transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 4 synchronously translates the reticle stage RT and the workpiece table WT to expose the workpiece to the amplified laser light B2 reflecting the reticle pattern. After the reticle pattern is transferred onto the semiconductor wafer by the exposure process described above, an electronic device can be manufactured through a plurality of processes.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A gas laser device comprising:
 a laser oscillator configured to output laser light; and
 a laser amplifier configured to amplify the laser light and output the amplified laser light, the laser amplifier including:
  a discharge chamber accommodating a pair of electrodes for causing discharge;
  an input coupling optical system configured to cause at least a part of the laser light to be transmitted toward the discharge chamber; and
  an output coupling optical system configuring an optical resonator together with the input coupling optical system and configured to cause at least a part of the laser light transmitted through the input coupling optical system and the discharge chamber to be transmitted therethrough and output the amplified laser light, the output coupling optical system and the input coupling optical system facing each other, and
 a first focal point of the input coupling optical system in a first direction being perpendicular to a direction of the discharge chamber and a second focal point of the output coupling optical system in the first direction coinciding with each other at a position between the input coupling optical system and the output coupling optical system, wherein the input coupling optical system includes a first surface and a second surface through which the laser light is transmitted, the second surface facing the discharge chamber, the output coupling optical system includes a third surface and a fourth surface through which the laser light is transmitted, the third surface facing the discharge chamber, the third surface and the second surface facing each other, a curvature radius of the second surface in the first direction is larger than a curvature radius of the third surface in the first direction, a distance from the second surface to the first focal point and a distance from the third surface to the second focal point are different from each other, and a resonator length of the optical resonator coincides with a sum of the distance from the second surface to the first focal point and the distance from the third surface to the second focal point.

2. The gas laser device according to claim 1, wherein the first surface being a convex surface and the second surface being a concave surface.

3. The gas laser device according to claim 2, wherein the first surface and the second surface have a same curvature radius.

4. The gas laser device according to claim 2, wherein the third surface being a concave surface and the fourth surface being a convex surface.

5. The gas laser device according to claim 4, wherein the third surface and the fourth surface have a same curvature radius.

6. The gas laser device according to claim 1, further comprising:
a beam monitor configured to measure beam divergence of the amplified laser light;
a linear stage configured to move the output coupling optical system to adjust a distance between the input coupling optical system and the output coupling optical system; and
a processor configured to control the linear stage based on a measurement result of the beam divergence to adjust relative positions between the first focal point and the second focal point such that the first focal point and the second focal point coincide with each other.

7. The gas laser device according to claim 1, wherein each of the input coupling optical system and the output coupling optical system includes a cylindrical lens having a curvature in the first direction.

8. The gas laser device according to claim 1, wherein the curvature radius of the second surface in the first direction is 102% or more and 110% or less of the resonator length, and
the curvature radius of the third surface in the first direction is 90% or more and 98% or less of the resonator length.

9. The gas laser device according to claim 1, wherein the laser light is incident on the input coupling optical system at a position shifted in the first direction with respect to a center axis of the optical resonator.

10. The gas laser device according to claim 9, wherein a distance between the center axis and the incident position of the laser light onto the input coupling optical system is equal to or more than (He−Hb)/4 and equal to or less than (He−Hb)/2, where He represents a width of the electrodes in the first direction and Hb represents a beam width of the laser light in the first direction.

11. The gas laser device according to claim 9, further comprising:
a laser monitor configured to measure either a beam width or an energy density of the amplified laser light;
an optical path adjustment mechanism arranged between the laser oscillator and the laser amplifier and configured to adjust the incident position of the laser light onto the input coupling optical system; and
a processor configured to control the optical path adjustment mechanism based on a measurement result of the beam width or the energy density.

12. The gas laser device according to claim 1, wherein the laser light is incident on the input coupling optical system at an angle shifted in the first direction with respect to a center axis of the optical resonator.

13. The gas laser device according to claim 12, wherein the angle is equal to or more than 0.2 mrad and equal to or less than 0.8 mrad.

14. The gas laser device according to claim 12, further comprising:
a laser monitor configured to measure either a beam width or an energy density of the amplified laser light;
an optical path adjustment mechanism arranged between the laser oscillator and the laser amplifier and configured to adjust an incident direction of the laser light onto the input coupling optical system; and
a processor configured to control the optical path adjustment mechanism based on a measurement result of the beam width or the energy density.

15. The gas laser device according to claim 1, wherein the first surface being a planar surface and the second surface being a concave surface and having a higher reflectance than the first surface.

16. The gas laser device according to claim 15, wherein the third surface being a concave surface and having a higher reflectance than the fourth surface and the fourth surface being a planar surface.

17. The gas laser device according to claim 16, further comprising a convex lens configured to cancel a change in wavefront when the laser light is transmitted through the second and third surfaces.

18. An electronic device manufacturing method, comprising:
generating amplified laser light using a gas laser device;
outputting the amplified laser light to an exposure apparatus; and
exposing a photosensitive substrate to the amplified laser light in the exposure apparatus to manufacture an electronic device,
the gas laser device including a laser oscillator configured to output laser light and a laser amplifier configured to amplify the laser light and output the amplified laser light,
the laser amplifier including:
a discharge chamber including a pair of electrodes for causing discharge;
an input coupling optical system configured to cause at least a part of the laser light to be transmitted toward the discharge chamber; and
an output coupling optical system configuring an optical resonator along with the input coupling optical system and configured to cause at least a part of the laser light transmitted through the input coupling optical system and the discharge chamber to be transmitted therethrough and output the amplified laser light, the output coupling optical system and the input coupling optical system facing each other, and a first focal point of the input coupling optical system in a first direction being perpendicular to a direction of the discharge and a second focal point of the output coupling optical system in the first direction coinciding with each other at a position between the input coupling optical system and the output coupling optical system, wherein the input coupling optical system includes a first surface and a second surface through which the laser light is transmitted, the second surface facing the discharge chamber, the output coupling optical system includes a third surface and a fourth surface through which the laser light is transmitted, the third surface facing the discharge chamber, the third surface and the second surface facing each other, a curvature radius of the second surface in the first direction is larger than a curvature radius of the third surface in the first direction, a distance from the second surface to the first focal point and a distance from the third surface to the second focal point are different from each other, and a resonator length of the optical resonator coincides with a sum of the distance from the second surface to the first focal point and the distance from the third surface to the second focal point.

* * * * *